United States Patent [19]

in den Bäumen et al.

[11] Patent Number: 5,676,866
[45] Date of Patent: Oct. 14, 1997

[54] APPARATUS FOR LASER MACHINING WITH A PLURALITY OF BEAMS

[75] Inventors: Joachim Schulte in den Bäumen, Aalen; Robert Grub, Königsbronn-Zang; Herbert Gross, Aalen; Jürgen Schweizer, Westhausen; Hans-Jürgen Kahlert, Göttingen; Siegfrid Dippon, Gechingen; Wilhelm Tamm, Aidlingen, all of Germany; Si-Ty Lam, Pleasanton, Calif.; Heinrich Endert, Witzenhausen-Ermschwerd, Germany

[73] Assignees: Carl-Zeiss Stiftung, Oberkochen, Germany; Hewlett-Packard Company, Palo Alto, Calif.; Lambda Physik GmbH, Göttingen, Germany

[21] Appl. No.: 422,577

[22] Filed: Apr. 14, 1995

[30] Foreign Application Priority Data

Jan. 1, 1994 [DE] Germany ............... 44 23 040
Apr. 14, 1994 [EP] European Pat. Off. ......... 94105764

[51] Int. Cl.⁶ .................................. B23K 26/06
[52] U.S. Cl. ................. 219/121.77; 219/121.74
[58] Field of Search ............. 219/121.73, 121.74, 219/121.75, 121.76, 121.77, 121.68; 250/492.1, 492.2, 492.22, 492.23; 359/203, 204, 223, 846, 850, 865

[56] References Cited

U.S. PATENT DOCUMENTS

| | | |
|---|---|---|
| 4,553,017 | 11/1985 | Addleman . |
| 4,623,776 | 11/1986 | Buchroeder et al. . |
| 4,713,518 | 12/1987 | Yamazaki et al. . |
| 4,744,615 | 5/1988 | Fan et al. ............... 219/121.77 |
| 4,947,047 | 8/1990 | Muraki ..................... 250/492.2 |
| 4,950,862 | 8/1990 | Kajikawa . |
| 5,041,862 | 8/1991 | Rossman et al. . |
| 5,055,653 | 10/1991 | Funami et al. . |
| 5,101,091 | 3/1992 | Grub et al. ............ 219/121.74 |
| 5,113,055 | 5/1992 | Kuriyama . |
| 5,268,554 | 12/1993 | Ream . |
| 5,302,798 | 4/1994 | Inagawa et al. ........ 219/121.7 |
| 5,517,000 | 5/1996 | Nishiwaki et al. ...... 219/121.77 |

FOREIGN PATENT DOCUMENTS

| | | |
|---|---|---|
| 90615 | 10/1983 | European Pat. Off. ........ 219/121.73 |
| 0360328 | 3/1990 | European Pat. Off. . |
| 2708039 | 4/1979 | Germany . |
| 4111876 | 10/1991 | Germany . |
| 4328894 | 3/1994 | Germany . |
| 2-175090 | 7/1990 | Japan ...................... 219/121.73 |
| WO 80/02393 | 11/1980 | WIPO . |

Primary Examiner—Geoffrey S. Evans
Attorney, Agent, or Firm—Walter Ottesen

[57] ABSTRACT

An apparatus for laser machining by creating a plurality of discrete and separate beams which are sent to a deflecting device including a support and a plurality of individual elements that act independently and are individually controlled to machine different points on the workpiece simultaneously.

27 Claims, 4 Drawing Sheets

APPARATUS FOR LASER MACHINING WITH A PLURALITY OF BEAMS

FIELD OF THE INVENTION

The invention relates to a material machining arrangement having at least one machining beam. In this arrangement, the machining beam is guided through a device to discrete points on a surface of a specimen to be machined. This device is controllable at least in one direction.

BACKGROUND OF THE INVENTION

Material machining arrangements of this kind belong to the state of the art for a long time. The following processes are available for generating fine holes in flexible and hard printed circuit boards.

With mechanical boring in a manner generally known, up to several hundred bores can be bored simultaneously in printed circuit boards with special bore machines.

It is here disadvantageous that the smallest obtainable bore diameter is approximately 200 μm because of the limited mechanical stability of thin drills. Furthermore, it is seen as disadvantageous that the arrangement of the drill holes is fixed because of the configuration of the drilling machine. A change of the drill hole arrangement requires a time-consuming reconfiguration of the drilling machine.

Printed circuit boards can be coated realizing photochemical techniques such that the desired holes can be etched. The complexity of the method is here disadvantageous. More specifically, the printed circuit boards must be coated a number of times and again stripped (removal of the coating). Further disadvantages of this processing are seen with respect to the environmental problem presented by the etching baths and in the double-spherical form of the holes resulting from the etching process with the holes having typically etched lips.

Holes can be "bored" in pretreated printed circuit boards by laser beams of suitable wavelength via a laser light resistant mask. Hole diameters up to a few micrometers can be obtained. This method has the disadvantage of a fixed arrangement of the bore holes because of the structuring of the mask so that a change of the bore hole pattern requires another mask.

Boring and structuring can be achieved without a mask when using the laser individual beam method. The laser beam is directed individually to each location whereat a hole is wanted. The significant disadvantage here is the time requirement for generating a plurality of holes.

An arrangement is known, for example, from U.S. Pat. No. 5,268,554. Here, the beam of a laser is focused via different mirrors onto the surface of a specimen to be machined. The position of a deflecting mirror can be changed in two axes by means of actuators and the laser beam can be guided to discrete work points in a specific area on the surface of the specimen to be machined. Several machining points are machined sequentially. It is furthermore disadvantageous that the point of incidence on the workpiece surface has a different size in dependence upon the deflection of the laser beam.

A material machining arrangement is disclosed in U. S. Pat. No. 5,113,055 which includes an optical system of several mirror segments arranged one behind the other. With the aid of this system, selectively several points on a workpiece surface can be approached sequentially.

A multiple beam generating device is disclosed in U. S. Pat. No. 4,553,017 wherein several beams are generated from one energy beam by means of a grating. The loci of the beams all lie on a line.

A further beam dividing device for laser beams is disclosed in German Patent 4,328,894. This device generates two discrete beams from a laser beam which then impinge upon two points on the workpiece surface. Reference may also be made to European Patent publication 0,360,328, German Patents 4,111,876 and 2,708,039 and U.S. Pat. No. 4,623,776.

Material machining devices are disclosed in U.S. Pat. No. 4,713,518 and 5,055,653 in which several discrete laser beams are generated from one laser beam by means of several lenses lying one next to the other in one direction.

A material machining device is disclosed in U.S. Pat. No. 4,950,862 wherein a laser beam is directed onto a lens array by means of a galvanometer mirror. Each lens of the array images one beam onto the workpiece surface.

SUMMARY OF THE INVENTION

It is an object of the invention to provide a material machining arrangement for the simultaneous machining at several points on a workpiece surface. The position of the points can change statically or dynamically by means of a controllable deflecting device.

This task is solved according to the invention by the characterizing portion of the first patent claim. Further advantageous configurations of the inventive concept are described in the dependent claims.

The material machining arrangement for machining a surface of a workpiece simultaneously uses several discrete machining beams in order to make possible a more rapid machining on the workpiece surface.

Each machining beam is deflected by an element of a deflecting device. Each element is assigned to a particular beam and the particular deflection can be freely adjusted in at least one axis by the control device.

This makes possible the simultaneous machining of different points on a surface of a specimen to be machined.

The position of the individual elements of the deflecting device can be changed in a targeted manner by means of a control and the individual elements of the deflecting optics can be displaced discretely in their position in at least one coordinate direction. For this reason, speeds of machining as well as new possibilities far beyond the state of the art are obtained. These increased speeds and new possibilities are obtained because the change of deflection can take place statically (that is, after each machining) as well as dynamically (that is, during the machining).

Not only can machining at a point be performed but also, simultaneously, linear structures can be generated on the workpiece surface.

With the invention it is possible to obtain a significantly more rapid material machining arrangement because machining can be performed simultaneously at several freely selectable locations on the surface of the workpiece. These locations must not necessarily lie at the same position on the next workpiece but can be freely determined.

The deflecting device can advantageously be displaced in the beam axis when the machining beams are arranged parallel to each other forward of the deflecting device. This displacement in the beam axis takes place without a negative effect on the workpiece surface.

It is advantageous to arrange the points of rotation of the elements of the deflecting device all in one plane in order to obtain a compact machining device. This, however, has optical disadvantages.

If in contrast, the elements of the deflecting device are all arranged on a parabola, then all beams in the machining chamber run telecentrically and are distributed uniformly. These advantages are accompanied by the disadvantage that different intercept distances for each beam are obtained from which problems with respect to sharpness definition result.

This can be avoided by arranging the elements of the deflecting device on a circle concentric to the focus point which lies precisely at the center of the collecting mask and by configuring the surface of the elements of the deflecting device to be spherical. But this has the disadvantage of higher costs.

The surface area to be machined can be freely selected when the machining beams coming from the elements of the deflecting device are axis-parallel to their particular main beam. However, the spacing between the scanning objective and the surface to be machined must remain fixed.

Diffracting and/or reflecting elements can be used advantageously as deflecting elements in the deflecting device. These elements afford the advantage that they can be produced very economically in accordance with known state of the art.

Especially electromagnetic beams can be excellently deflected when the deflecting device is built up of reflecting elements. This type of radiation is very important for machining material.

Mirrors are especially suitable as reflecting elements.

The deflecting device is advantageously made up of segments. This permits a very economical manufacture.

Each of the segments should be movable individually in or about at least one coordinate axis. In addition to a position change on an axis in the workpiece plane, this also makes possible a variation in elevation of each individual focus with respect to the workpiece surface.

It is advantageous when the segments are movable in or about one or two coordinate axes. This makes it possible to machine all points on the workpiece surface, not only the machining of points on a machining line. In addition, this also makes possible a change in elevation of the focal point of each individual machining beam.

The surface of the reflecting element can advantageously be planar so that the incoming as well as the reflecting rays of the machining beams can run parallelly with the least possible influence on the radiation.

An imaging optic can be mounted behind the deflecting device in an advantageous manner so that the machining beams can impinge as perpendicularly as possible on the surface of the workpiece to be machined.

The surfaces of the elements of the deflecting device can, however, also be so formed (for example, when using mirrors) that a reflected ray is focused on the surface of the workpiece by the elements of the deflecting device. Then, a scanning objective is in some cases unnecessary.

The machining rays are advantageously laser light because very good beam guiding techniques at reduced costs are known for laser light.

Laser rays afford the further advantage that they are easily guided and can be changed with low cost optics. However, all other dividable beams can be used such as electron beams, X-rays, sand or water jets and the like.

Especially when the machining rays are laser light, it is advantageous when the device includes a discrete deflecting optic for each machining beam.

A deflection by means of the opto-acoustic effect (density variation in a chamber by means of sound waves) would also be possible. However, this does not always supply the desired beam quality and the realization is very difficult for corresponding miniaturization of equipment.

It is advantageous when a diffracting element is contained in this deflecting device. This makes possible the use of beams which incident parallelly on the deflecting device and which are focused by the deflecting device on the surface of the workpiece.

This diffracting element is advantageously disposed on or behind a reflecting element so that it can be used simultaneously by many machining beams.

A beam homogenizer can advantageously be provided rearward of the laser so that the radiation coming from the laser has an equally great energy density for all machining beams. Such a beam homogenizer is disclosed, for example, in U.S. Pat. 5,041,862. With this beam homogenizer, it can be made certain that a plurality of machining beams generated from a laser beam all have the same intensity.

The laser is advantageously driven in pulsed operation because, with pulsed lasers, a higher energy with reduced complexity can be obtained, on the one hand, and, on the other hand, a more targeted surface machining can be carried out with pulsed radiation while preventing the unwanted thermal side effects on the workpiece.

The intensity of the laser flash can be so selected that only a portion of the material is removed. This permits a removal of the surface in different planes and line structures can be generated on the surface of the workpiece to be machined.

The number of necessary machining beam sources is drastically reduced when a beam divider device is provided which divides at least one machining beam into several discrete machining component beams. In this way, an intense beam is divided into several weaker beams with each beam having adequate energy density. This enables costs to be reduced for generating the machining beams.

The beam dividing device is then mounted forward of the controllable deflecting device in an advantageous manner.

A very simple configuration is obtained when the beam divider device is made up of several lenses.

This simple configuration is supported when the beam divider device is assembled from two arrays which assure that the individual beams have a certain spacing with respect to each other downstream of the beam divider device.

In order to machine an area individually as fast as possible, it is advantageous to provide for dividing the machining beams with respect to surface. It is then advantageous when the beam dividing device is made of an array which generates a two-dimensional distribution of the generated component beams.

An optical magnifying system is advantageously mounted behind the beam dividing device in order to adapt the dimensioning of the machining beam field to the dimensioning of the deflecting device.

The machining beams should advantageously impinge upon the surface of the printed circuit boards to be machined at an angle $\alpha$ which is not too large (less than 5°). This makes later the assembly of electrical and/or electronic components simple.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
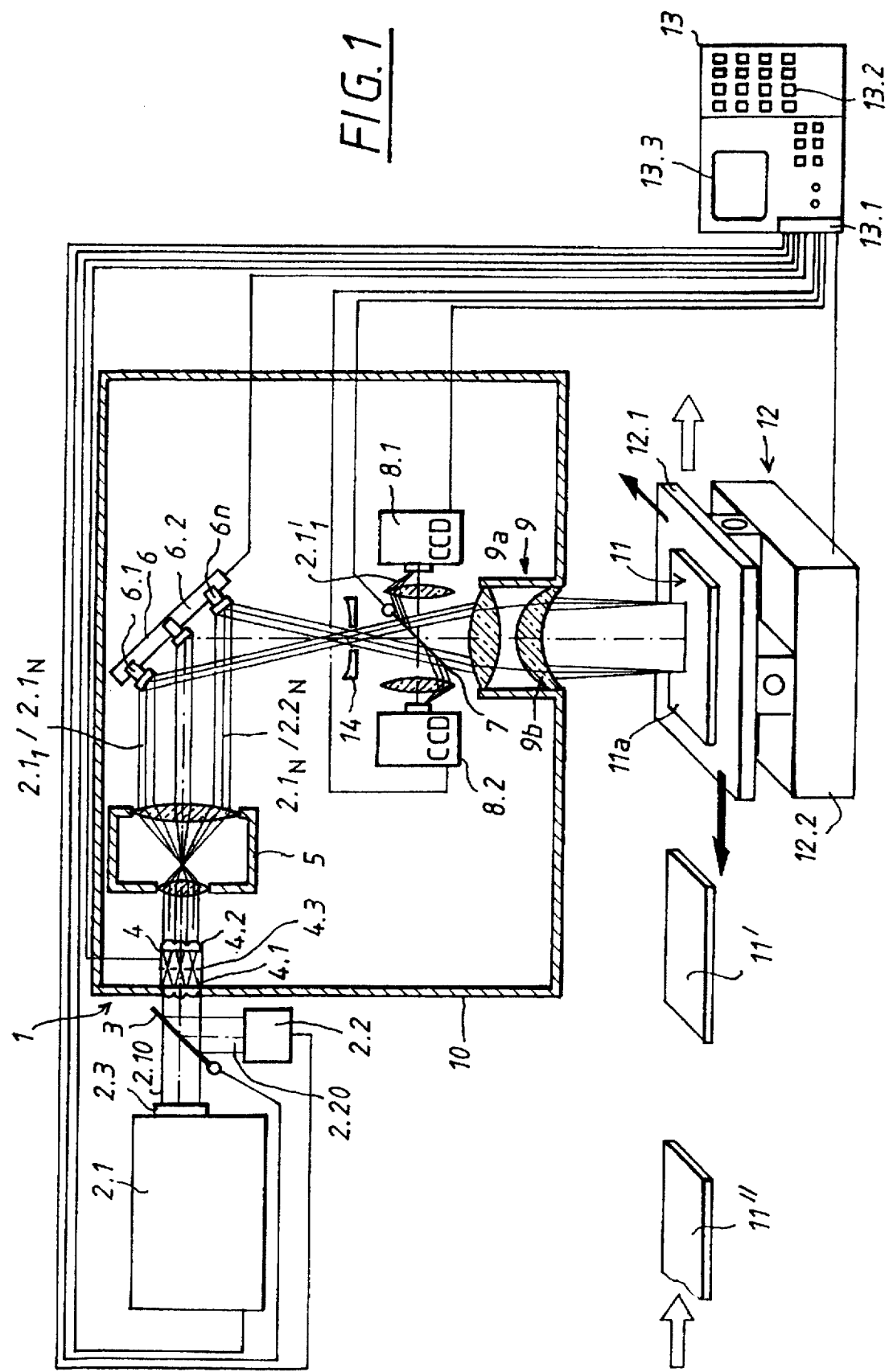
FIG. 1 shows a schematic representation of the entire configuration.

The embodiment of a realization of the material machining arrangement 1 according to the invention shown in FIG. 1 is provided for generating a hole pattern on a printed circuit board 11. Printed circuit boards 11 of this kind are needed in many variations as build-up aids and connecting vehicles of electrical and electronic components in electronics.

It is essential for the material machining arrangement 1 that it simultaneously has several machining beams $(2.1_1, \ldots, 2.1_N)$. These machining beams are all deflected onto different discrete points on the surface 11a of the specimen 11 to be machined. In this way, the hole or line pattern to be generated on the surface 11a of specimens (11, 11', 11'', ...), which are to be processed sequentially, can differ completely from each other.

Figure 3:
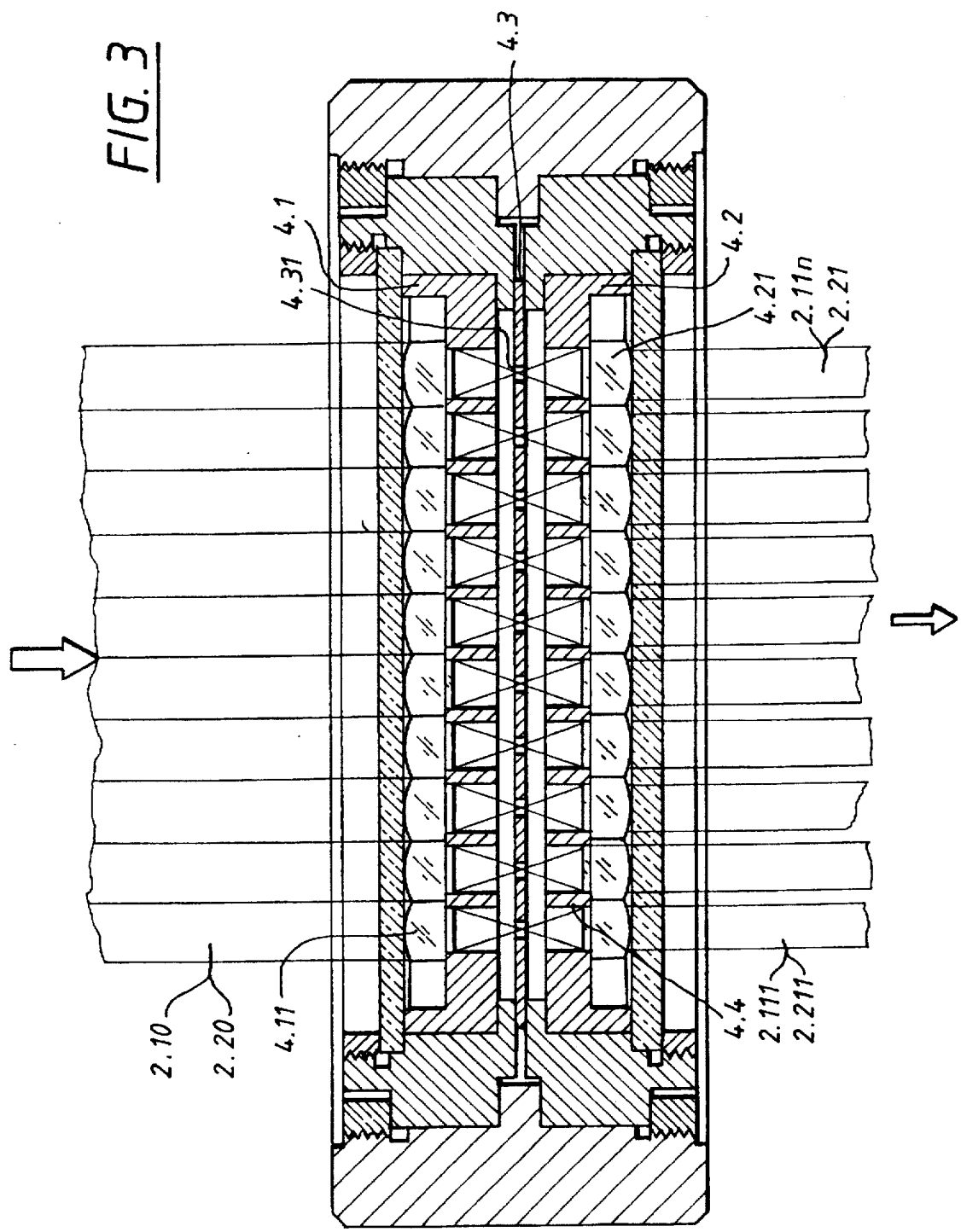
FIG. 3 is a side detail view of the beam dividing device.
Figure 4:
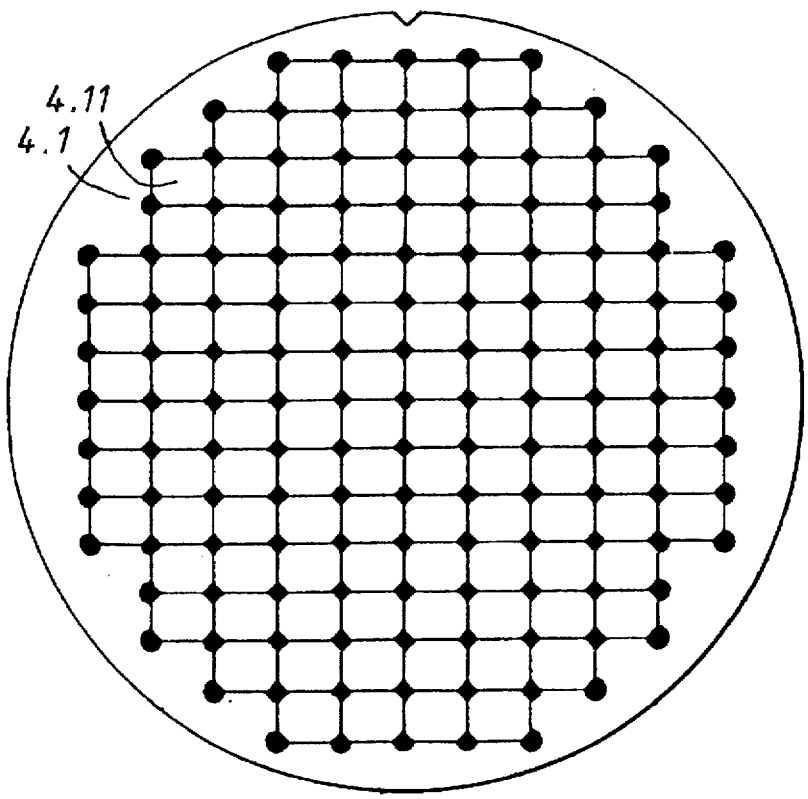
FIG. 4 is a plan view of the beam dividing device.

The machining arrangement 1 has a laser beam input having a microlens optic for generating the individual machining beams $(2.1_1, \ldots, 2.1_N)$. The microlens optic is used as a beam divider device 4 in which many individual beams $(2.1_2, \ldots, 2.1_N)$ having parallel beam paths are generated from the incident laser beam (2.10, 2.20). The beam divider device 4 is shown in greater detail in FIGS. 3 and 4. The device comprises essentially two lens arrays (4.1, 4.2) arranged one behind the other with each lens array having a plurality of individual lenses (4.11, 4.21) arranged to define a surface. A pinhole diaphragm plate 4.3 is mounted between the two lens arrays (4.1, 4.2) and has a corresponding number of pinholes 4.31.

The incident laser beam (2.10, 2.20) is then broken down into many component laser beams $((2.1_1, \ldots, 2.1_N), (2.2_1, \ldots, 2.2_N))$ which have a certain spatial spacing to each other. The beam diameter of the component laser beams $((2.1_1, \ldots, 2.1_N), (2.2_1, \ldots, 2.2_N))$ can be changed by changing the lenses 4.21 of the rearward array 4.2 relative to the lenses 4.11 of the forward array 4.1. When desired, one or more diameters of the component laser beams $((2.1_1, \ldots, 2.1_N), (2.2_1, \ldots, 2.2_N))$ can be changed in that actuators are built into the supports 4.4 or the entire supports 4.4 can be configured as actuators in accordance with the state of the art (for example, piezo actuators, piston actuators or the like). In this way, a change in spacing between the lenses (4.11, 4.21) of the two lens arrays (4.1, 4.2) can be obtained.

Depending upon the quality of the radiation of the laser beam 2.10 emanating from the main laser.2.1, the laser beam 2.10 can be homogenized with respect to the quality of the radiation with a lens raster 2.3 according to U.S. Pat. No. 5,041,862 before impinging upon the beam divider unit 4. The lens raster 2.3 has a downstream device for parallelizing the laser beam 2.10.

The laser beam 2.20 of the marking laser 2.2 can pass through the beam divider device 4 at the same time with the laser beam 2.10 from the main laser 2.1. The marking laser 2.2 is coupled into the beam path of the main laser 2.1 by a beam splitter 3. The coating of the beam splitter 3 must be so configured that the laser beam 2.10 of the main laser 2.1 passes through the beam splitter 3 as undisturbed as possible and with the least possible loss; whereas, the laser beam 2.20 of the marking laser 2.2 is coupled into the main beam path as completely as possible.

A certain amount of the radiation energy is lost because of the beam splitter 3 and because of the beam divider device 4. The laser beam (2.10, 2.20) loses a significant amount of energy especially in the beam divider device 4 at the edges of the lenses 4.11 and at the pinhole diaphragm 4.3. The pinhole diaphragm 4.3 should be cooled as required. A significant loss of laser energy occurs especially at the array 4.1 and this loss can be minimized by an optimized arrangement of the individual lenses 4.11 of the array 4.1.

Figure 5:
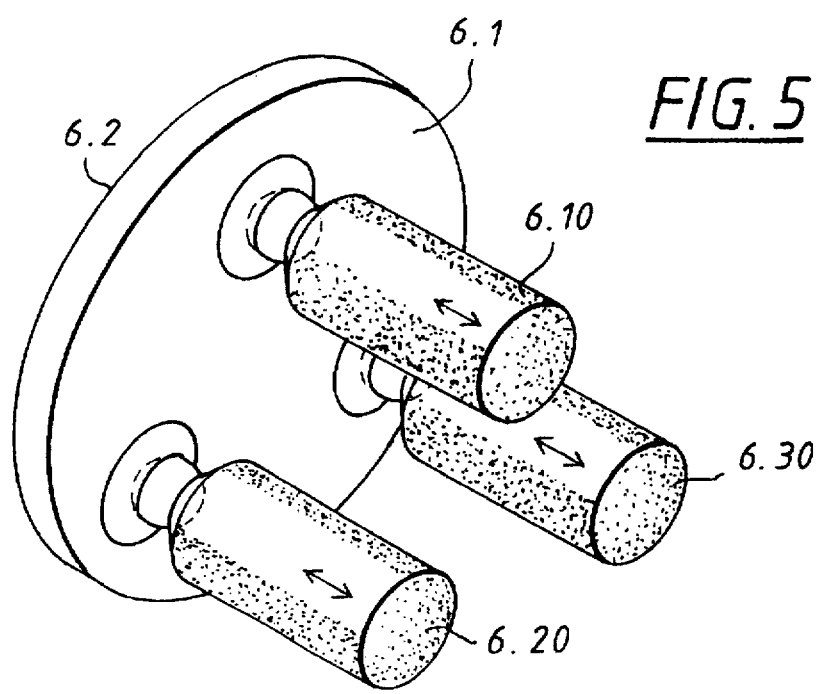
FIG. 5 is a bottom plan view of an element of the deflecting optic.

An optical magnification system 5 is mounted rearward of the beam divider device 4. This magnification system 5 adapts the beams $((2.1_1, \ldots, 2.1_N), (2.2_1, \ldots, 2.2_N))$ coming from the beam divider device 4 to the dimensions of the deflecting optic 6. The deflecting optic 6 is shown in detail in FIG. 5.

The deflecting optic 6 comprises essentially a plurality of individual elements $(6_1, \ldots, 6_N)$ having mirrored surfaces 6.2. This deflecting optic 6 can, for example, be moved in three axes via three actuators (6.10, 6.20, 6.30), respectively. These actuators can, for example, be piezocrystals or piston actuated elements. The component beams $((2.1_1, \ldots, 2.1_N), (2.2_1, \ldots, 2.2_N))$ reflected by the deflecting optic 6 then impinge on a scanning objective 9 which focuses the component beams $((2.1_1, \ldots, 2.1_N), (2.2_1, \ldots, 2.2_N))$ onto the surface 11a of the workpiece 11 to be machined. At the same time, the scanning objective 9 ensures that the laser component beams $((2.1_1, \ldots, 2.1_N), (2.2_1, \ldots, 2.2_N))$ impinge perpendicularly or at least almost perpendicularly onto the surface 11a of the workpiece 11 to be machined.

A collecting mask 14 is mounted forward of the scanning objective 9 and collects all component beams $((2.1_1, \ldots, 2.1_N), (2.2_1, \ldots, 2.2_N))$ which are not intended to reach the workpiece surface 11a. This collecting mask 14 is so configured that it nullifies the component beams $((2.1_1, \ldots, 2.1_N), (2.2_1, \ldots, 2.2_N))$ which impinge thereupon. This can lead to a very considerable warming of the mask 14 so that the latter is intensively cooled in correspondence thereto.

Still another beam splitter 7 is mounted between the collecting mask 14 and the scanning objective 9. This beam splitter 7 deflects a small portion of the laser light $((2.1_1, \ldots, 2.1_N), (2.2_1, \ldots, 2.2_N))$ impinging thereupon in the direction toward a camera 8.2. This camera 8.2 is a CCD-camera having a resolution so great that, with this camera, the position of the component beams $((2.1_1, \ldots, 2.1_N), (2.2_1, \ldots, 2.2_N))$ can be controlled with sufficient precision on the surface 11a of the workpiece 11 to be machined. The camera 8.2 then controls the deflecting optic 6. When the component laser beam $((2.1_1, \ldots, 2.1_N), (2.2_1, \ldots, 2.2_N))$ has impinged upon the surface 11a of the workpiece 11 via the scanning objective 9, then the scanning objective 9 reflects back a portion of the component laser beam. This back-reflected component laser beam $((2.1_1, \ldots, 2.1_N), (2.2_1, \ldots, 2.2_N))$ again passes through the scanning objective 9 and is deflected at the beam splitter 7 to a second camera 8.1.

The second camera 8.1 is also a CCD-camera and has a sufficiently large resolution of the work surface 11a of the workpiece 11 to be viewed. The progress of the component laser beams $((2.1_1, \ldots, 2.1_N), (2.2_1, \ldots, 2.2_N))$ on the surface 11a of the workpiece can be controlled by means of this camera 8.1 and, also with this camera, a determination can be made as to where the machining component beams $((2.1_1, \ldots, 2.1_N), (2.2_1, \ldots, 2.2_N))$ actually impinge upon the surface 11a of the workpiece 11.

The workpiece 11 to be machined is itself mounted on an X-Y carrier 12 which moves the workpiece 11 in a plane (X, Y). When the workpiece 11 has a size which is greater than can be machined by the machining arrangement 1, the carrier 12 is so driven that, after ending the machining of a surface unit, a next adjacent surface unit can be machined. The precision with which the carrier 12 can be adjusted is so high that the deviations of the machining points are sufficiently less than the set values mentioned.

All changeable elements (2.1, 2.2, 3, 4.2, ($6_1$,..., $6_N$), 7, 12) of the material machining arrangement 1 are connected to the input and the output 13.1 of a control 13. Furthermore, the cameras (8.1, 8.2) are connected to the input of the control. The control 13 is connected to the changeable elements (2.1, 2.2, 3, 4.2, ($6_1$,..., $6_N$), 7, 12) as well as to the cameras (8.1, 8.2). Because of these connections, the control receives an announcement as to the actuating state of the individual changeable elements (2.1, 2.2, 3, 4.2, ($6_1$,..., $6_N$), 7, 12) and is able to adjust the same in a targeted manner. The control 13 includes closed-loop control circuits which ensure that the surface 11a of the workpiece 11 is machined in the desired manner. In addition, the control 13 has an input 13.2 for inputting new machining parameters. Furthermore, the control has at least one monitor 13.3. The connected parts of the machining arrangement 1 can be adjusted by the control 13 or the beam splitters (3, 7) can be pivoted out of the beam path as desired.

The operation of the MBG and its drive of the arrangement 1 at the central control 13 can be subdivided into the following modes of operation:

stand-by operation;
test and monitoring operation;
set-up mode of operation; and,
working mode of operation.

After switch-on, the arrangement goes into the test and monitoring operation wherein all components connected to the control 13 are checked for faults. In the case where there are no faults, the control 13 then switches the arrangement 1 into the stand-by mode of operation wherein all components are operationally ready but not active.

The operation of the arrangement is described further below together with the description of the set-up and working modes of operation.

The coordinate table 12 is driven by the control 13 and positions the workpiece 11 or the portion of the surface 11a thereof to be machined in the work area below the scanning objective 9 in the set-up operation. A check is made as to the presence of the workpiece 11 by means of the viewing device 8.1 whereafter the hole image wanted on the workpiece 11 is adjusted by means of targeting laser beams as follows.

Starting from the control 13, either the work laser 2.1 generates the laser beam 2.10 or a so-called pilot or targeting laser 2.2 is activated. The laser beam 2.10 is attenuated by the pivoted-in beam splitter 3 in such a manner that it no longer has any machining effect on the workpiece 11 but instead generates only light points observable by the monitoring systems 8.1 and 8.2. The so-called pilot or targeting laser 2.2 transmits a laser beam 2.20 into the machining arrangement 1 via the beam splitter 3 and this laser beam 2.20 likewise generates only light points on the workpiece 11.

The laser beam 2.1 or the laser beam 2.2 is now broken up by the microlens optic 4 into a plurality of individual component beams (($2.1_1$,..., $2.1_N$), ($2.2_1$,..., $2.2_N$)) in correspondence to the number of microlenses (4.11, 4.21).

The microlens optic 4 comprises essentially the microlens fields 4.1 and 4.2 as well as a field diaphragm 4.3. This break-up takes place essentially by means of a suitable arrangement of the microlens fields 4.1 and 4.2 with respect to each other. The individual component beams (($2.1_1$,..., $2.1_N$), ($2.2_1$,..., $2.2_N$)) run parallel to each other and are advantageously expanded and enlarged by means of a magnification optic 5.

The individual component beams (($2.1_1$,..., $2.1_N$), ($2.2_1$,..., $2.2_N$)) are now clearly separate from each other but yet are in a fixed geometric arrangement with respect to each other. These individual component beams (($2.1_1$,..., $2.1_N$), ($2.2_1$,..., $2.2_N$)) now impinge upon the tilt mirror field 6 which operates as a deflecting unit. The individual tilt mirrors ($6_1$,..., $6_N$) are advantageously fixed in the tilt mirror holder 6.2 so that each individual component laser beam $2.1_n$ always impinges precisely on one and the same tilt mirror $6_n$ for all individual mirrors $6_1$ to $6_N$.

Figure 2:
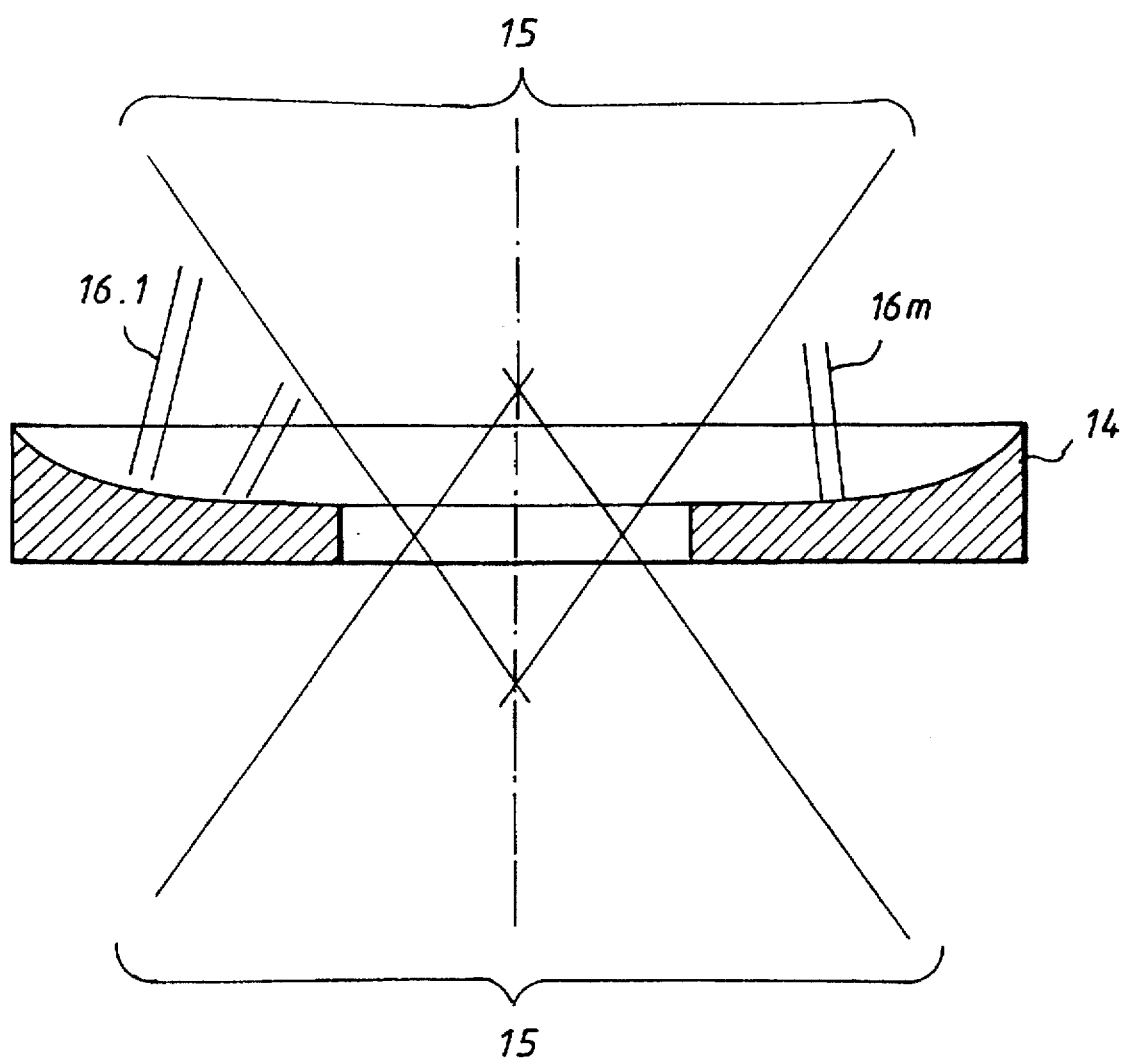
FIG. 2 is a detail view of a collecting mask.

The elements of the tilt mirror 6 now reflect the component laser beams (($2.1_1$,..., $2.1_N$), ($2.2_1$,..., $2.2_N$)) in dependence upon their respective positionings in such a manner that they all pass through the opening of the collecting mask 14 in regular operation and impinge upon the beam splitter 7. If certain component laser beams (($2.1_1$,..., $2.1_N$), ($2.2_1$,..., $2.2_N$)) are not intended to impinge upon the workpiece 11, then the corresponding tilt mirrors ($6_1$,..., $6_N$) are driven and displaced via the control 13 so that these component laser beams (16.1,..., 16.M) are deflected into the collecting mask 14 whereas the wanted beams pass through in a bundle 15 of rays (see FIG. 2).

The collecting mask 14 absorbs the component beams 16.m (16.1 to 16.M) completely which impinge thereupon.

The beam splitter 7, on the one hand, conducts the image of the component beams (($2.1_1$,..., $2.1_N$), ($2.2_1$,..., $2.2_N$)) coming from the mirrors ($6_1$,..., $6_N$) and passing through the collecting mask 14 into the viewing system 8.2 which evaluates the image and transmits the result to the control 13. If the desired radiation image and the actual radiation image do not correspond, the control 13 can undertake a correction by suitably driving the corresponding tilt mirrors ($6_1$,..., $6_N$).

The component beams (($2.1_1$,..., $2.1_N$), ($2.2_1$,..., $2.2_N$)) which pass through the beam splitter 7 are optically guided by the so-called scanning objective 9 so that they run telecentrically after leaving the scanning objective 9 and are focused on the surface 11a of the workpiece 11. Only low energy targeting beams ($2.2_1$ to $2.2_N$) are used in the set-up mode of operation. For this reason, these targeting beams only generate light points on the workpiece 11 at the locations at which the energy beams ($2.1_1$ to $2.1_N$) will later machine the workpiece 11. These light points are reflected at the surface of the workpiece 11 and the image of these light points is guided back through the scanning objective 9 and via the beam splitter 7 into the monitoring system 8.1 where they are evaluated and the result is transmitted to the control 13. If the desired radiation point image and actual radiation point image on the surface 11a of the workpiece 11 are not coincident, then the control 13 makes a correction by suitably driving the corresponding tilt mirrors ($6_1$ to $6_N$). The absolute correctness of the position of all light points can be checked via markers present on the workpiece 11. These markers are so configured that they are detected by the monitoring system 8.1.

If desired and actual radiation point images correspond to each other in the context of the fault tolerance, then the set-up mode of operation is successfully concluded and the control 13 can switch into the work mode of operation automatically or be switched into this mode manually.

In the set-up mode of operation, the tilt mirrors 6.n are so adjusted that the rays of the target laser 2.2 are at the locations on the workpiece surface 11a provided therefor. The beam splitter 3 is tilted out of the beam path in the machining mode of operation (and, if the target laser 2.2 was used, the target laser is now switched off and the machining laser 2.1 is activated) and the machining laser beam 2.10 now passes with full intensity into the optical arrangement, passes through the same optical path as the target laser 2.2 and the laser beams $(2.1_1, \ldots, 2.1_N)$ which pass through the collecting mask 14 machine the workpiece 11.

After ending the machining by means of the laser beams $(2.1_1, \ldots, 2.1_N)$ at the selected positions on the workpiece 11, the set-up mode of operation is again switched in and the X-Y-coordinate table 12 can displace the workpiece 11 in such a manner that the next zone of the workpiece 11 to be machined can be placed in the operating range of the laser component beams $((2.1_1, \ldots, 2.1_N), (2.2_1, \ldots, 2.2_N))$ below the scanning object 9. Thereafter, the targeting operation is again started.

If more locations are to be machined in the operating region of the laser beams $((2.1_1, \ldots, 2.1_N), (2.2_1, \ldots, 2.2_N))$ than there are laser beams $((2.1_1, \ldots, 2.1_N), (2.2_1, \ldots, 2.2_N))$, then, after ending the first machining step, the corresponding mirrors $(6_1, \ldots, 6_N)$ are driven in such a manner that the component laser beams $((2.1_1, \ldots, 2.1_N), (2.2_1, \ldots, 2.2_N))$ are directed to the desired new positions. Component laser beams $((2.1_1, \ldots, 2.1_N), (2.2_1, \ldots, 2.2_N))$ which are in excess of those required are directed by the corresponding mirrors $(6_1, \ldots, 6_N)$ into the collecting mask 14 provided therefor.

Alternatively, the mirrors $(6_1, \ldots, 6_N)$ can also be displaced while the work laser 2.1 is operating. In this way, continuous structures can be generated on or in the workpiece 11.

A pulsed excimer laser having a wavelength of 248 nm is especially suitable as a work laser 2.1 for a workpiece 11 made of polyimide foil having an average thickness of 50 µm. The polyimide foil is for printed circuit boards 11 which are to be machined as the workpiece. Such a UV-laser 2.1 can be driven in a controlled manner at a pulse frequency of, for example, 100 to 200 Hz. When subjected to approximately 100 radiations, a printed circuit board 11 of this kind can be penetrated without disturbing thermal effects occurring at the printed circuit board 11. A removal of 0.1 to 0.4 µm per irradiation takes place at an energy density of 1 J/cm² per pulse. A typical hole diameter is about 50 µm. The energy loss at the beam divider device 4 is in the order of magnitude of 50% but can be reduced by suitable configurations. The beam divider device 4 generates several hundred individual laser beams $((2.1_1, \ldots, 2.1_N), (2.2_1, \ldots, 2.2_N))$ (for example, 30×30, 50×50 and the like) depending upon configuration. These individual component laser beams can be distributed individually by a corresponding number of elements $(6_1, \ldots, 6_N)$ in the deflecting optic 6 on the surface 11a of the workpiece 11. The machining arrangement 1 according to the invention for boring or removing conductor paths on printed circuit boards 11 affords the following advantages:

(a) no limitation of hole diameter in the downward direction; that is, holes down to a diameter of about 5 µm are possible;

(b) no fixed arrangement of the holes bored but instead a variably adjustable hole image;

(c) no laser mask is required and therefore an improved utilization of the laser light generated;

(d) use of untreated printed circuit boards, that is, those without coating with copper, photoresistant material and the like;

(e) environmental problems of etching baths and other procedures which are problematic with respect to the environment are eliminated;

(f) geometrically good holes are formed, for example, without etched lips;

(g) variable and freely programmable hole images;

(h) hole images with variable and freely programmable hole densities;

(i) variable, freely programmable numbers of holes per printed circuit board;

(j) reduced machining time;

(k) the surface of the printed circuit board can be structured, that is, for example, by generating conductor paths;

(l) a high precision with respect to positioning of the bored holes;

(m) use of different lasers or laser radiation wavelengths; and, (n) capability of building into a machining assembly line with the workpieces on the machining assembly line being movable to and away from the machining station.

In the embodiment described above, the beam divider device 4 can be omitted when initially several individual beams $((2.11, \ldots, 2.1_N), (2.2_1, \ldots, 2.2_N))$ are introduced into the machining arrangement 1. The used beams $((2.11, \ldots, 2.1_N), (2.2_1, \ldots, 2.2_N))$ do not have to be laser beams as is the case with respect to the embodiments described and shown in the drawings. All deflectable beams can be used. For example, the generation of radiation for beams which can only be deflected with difficulty can be placed directly at or on the deflecting device 6. Such radiation is that which has too great an energy loss when there is a deflection thereof. This can, for example, be the nozzle in water jets or a laser diode for laser radiation.

Finally, a realization of the concept of the invention can, at a minimum, comprise one or more devices for generating the machining beams $(2.1_1, \ldots, 2.1_N)$ as well as a device 6, which is suitable for guiding the particular beams.

The above-mentioned use of the laser beams (2.10, 2.20) leaves open many possibilities for generating individual component beams $((2.1_1, \ldots, 2.1_N), (2.2_1, \ldots, 2.2_N))$. A direct or subsequent alignment parallel to each other is imparted to these individual component beams directly or subsequently so that they have a definite spacing to each other. The individual component beams $((2.1_1, \ldots, 2.1_N), (2.2_1, \ldots, 2.2_N))$ can be generated in many ways (gratings, beam splitters, . . . ) and be later formed. The generation of the beams discussed and explained with respect to the embodiment is, at the moment, only the simplest and most cost effective. A laser diode array (that is, surface arranged laser diodes) having a suitable frequency and energy density should in the future be a competitive way of generating the machining beams $((2.1_1, \ldots, 2.1_N), (2.2_1, \ldots, 2.2_N))$. The expanding optic 5 downstream of the beam divider device 4 can be omitted if the machining beams $(2.1_1, \ldots, 2.1_N)$ emanating from the beam divider device 4 already have the desired cross section.

The collecting mask 14 can be omitted when the machining beams $(2.1_1, \ldots, 2.1_N)$ are deflected onto an area suitable therefor by the deflecting device 6 outside of the surface 11a to be machined.

One of the two beam control cameras (8.1, 8.2) can be omitted when there is sufficient time for machining or inaccurate shots of radiation are permissible during machining or if it is ensured that the beam deflection 6 always takes place in the desired manner (control of the deflecting device).

The scanning objective 9 can be omitted when one allows an inclined machining of material at the edge or if the dimensions of the surface 11a to be machined permit this.

The X-Y-table 12 can be omitted when the surface 11a to be machined is never greater than the reflecting capability of the deflecting device 6.

The deflecting device 6 can in practice look differently even if laser beams (($2.1_1, \ldots, 2.1_N$), ($2.2_1, \ldots, 2.2_N$)) are used. In lieu of the reflecting surfaces, other known types of beam deflection (for example, planar lens pairs or rotating wedge pairs for laser beams) can be used. The use of the diffracting bodies means a greater loss of energy.

The indicating laser 2.2 can be omitted when the work laser 2.1 is sufficiently attenuated by the beam splitter 3 for determining the beam position on the workpiece surface 11a.

The beam cross sections used must not be round as shown; instead, any desired form which is possible in accordance with the known state of the art can be used.

The scanning objective 6 does not necessarily have to comprise two lenses (9.1, 9.2) arranged one behind the other; instead, the number of lenses can vary in the radiation axis as well as in the coordinate axis lying perpendicularly thereto.

The beam divider device 4 can be omitted when this task is assumed, for example, by the deflecting device 6.

What is claimed is:

1. A material machining arrangement for machining a surface of a workpiece, the arrangement comprising:

supply means for supplying a plurality of discrete machining beams which are separate from each other;

a deflecting device including a support and a plurality of individual elements mounted on said support for deflecting corresponding ones of said machining beams;

each of said individual elements being mounted on said support so as to be changeable in position independently of each other; and, control means for controlling said individual elements to discretely change the respective positions thereof in at least one coordinate direction to simultaneously machine different points on said surface of said workpiece with corresponding ones of said machining beams.

2. The material machining arrangement of claim 1, said supply means including means for arranging said machining beams so as to be parallel to each other forward of said deflecting device.

3. The material machining arrangement of claim 1, said individual elements being mounted on said support so as to define respective rotation points all arranged on an arcuate plane.

4. The material machining arrangement of claim 1, said supply means including a source for supplying a main beam defining an axis; and, said machining beams, which are incident upon said individual elements of said deflecting device, are axis-parallel to said main beam.

5. The material machining arrangement of claim 1, said machining beams, which come from said individual elements of said deflecting device, are each parallel to the axis of said main beam.

6. The material machining arrangement of claim 1, said individual elements being diffracting elements.

7. The material machining arrangement of claim 6, said individual elements being a plurality of respective segments.

8. The material machining arrangement of claim 7, said segments being individually movable in or about at least one coordinate axis.

9. The material machining arrangement of claim 7, said segments being movable in or about two coordinate axes.

10. The material machining arrangement of claim 1, said individual elements of said deflecting device being respective reflecting elements.

11. The material machining arrangement of claim 10, said reflecting elements being a plurality of respective mirrors.

12. The material machining arrangement of claim 10, each of said reflecting elements being planar.

13. The material machining arrangement of claim 1, further comprising an imaging optic mounted downstream of said deflecting device.

14. The material machining arrangement of claim 1, said supply means including a laser light source thereby defining said machining beams as laser light beams.

15. The material machining arrangement of claim 14, further comprising a beam homogenizer arranged downstream of said laser light source.

16. The material machining arrangement of claim 14, said laser light source being a pulsed laser light source.

17. The material machining arrangement of claim 14, wherein the intensity of a laser flash is so selected that only a portion of material is removed from said workpiece.

18. The material machining arrangement of claim 1, said supply means including a light source for supplying a machining beam; a beam divider device for dividing said machining beam into several discrete machining component beams; and, said beam divider device being mounted upstream of said deflecting device.

19. The material machining arrangement of claim 18, said beam divider device including a plurality of lenses corresponding to respective ones of said machining component beams.

20. The material machining arrangement of claim 18, said beam divider device including two arrays for ensuring that said machining beams have a specific spacing to each other downstream of the beam divider device.

21. The material machining arrangement of claim 18, said beam divider device including an array which generates a two-dimensional distribution of component beams.

22. The material machining arrangement of claim 18, further comprising an optical magnification system mounted downstream of said beam divider device.

23. The material machining arrangement of claim 1, wherein said workpiece is a printed circuit board.

24. The material machining arrangement of claim 1, wherein said component beams define a telecentric trace forward of said surface of said workpiece to be machined.

25. The material machining arrangement of claim 1, wherein said component beams are incident upon the portion of said workpiece to be machined at an angle $\alpha$ which is as small as possible and is preferably less than 5°.

26. The material machining arrangement of claim 1, said individual elements being reflecting elements.

27. The material machining arrangement of claim 1, said individual elements being diffracting and reflecting elements.

* * * * *

UNITED STATES PATENT AND TRADEMARK OFFICE
CERTIFICATE OF CORRECTION

PATENT NO. : 5,676,866
DATED : October 14, 1997
INVENTOR(S) : Joachim Schulte in den Baeumen, Robert Grub, Herbert Gross, Juergen Schweizer, Hans-Juergen Kahlert, Siegfrid Dippon, Wilhelm Tamm, Si-Ty Lam and Heinrich Endert It is certified that error appears in the above-identified patent and that said Letters Patent is hereby corrected as shown below:

On the title page, under [30]: delete "Jan. 1, 1994" and substitute -- Jul. 1, 1994 -- therefor.

In column 2, line 1: delete "loci" and substitute -- foci -- therefor.

In column 5, line 28: delete "(2.1$_2$" and substitute -- (2.1$_1$ -- therefor.

In column 10, lines 24 and 26: delete "(2.11" and substitute -- (2.1$_1$ -- therefor.

Signed and Sealed this

Fourteenth Day of April, 1998

Attest:

BRUCE LEHMAN

*Attesting Officer*         *Commissioner of Patents and Trademarks*